(12) United States Patent
Hanano et al.

(10) Patent No.: US 11,926,764 B2
(45) Date of Patent: Mar. 12, 2024

(54) POLISHING SOLUTION, POLISHING SOLUTION SET, POLISHING METHOD, AND DEFECT SUPPRESSING METHOD

(71) Applicant: Showa Denko Materials Co., Ltd., Tokyo (JP)

(72) Inventors: Masayuki Hanano, Tokyo (JP); Hisato Takahashi, Tokyo (JP); Toshio Takizawa, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 297 days.

(21) Appl. No.: 17/438,775

(22) PCT Filed: Apr. 2, 2019

(86) PCT No.: PCT/JP2019/014680
§ 371 (c)(1),
(2) Date: Sep. 13, 2021

(87) PCT Pub. No.: WO2020/202471
PCT Pub. Date: Oct. 8, 2020

(65) Prior Publication Data
US 2022/0162476 A1 May 26, 2022

(51) Int. Cl.
*C09G 1/02* (2006.01)
*H01L 21/321* (2006.01)

(52) U.S. Cl.
CPC ............ *C09G 1/02* (2013.01); *H01L 21/3212* (2013.01)

(58) Field of Classification Search
None
See application file for complete search history.

(56) References Cited

U.S. PATENT DOCUMENTS

| 2002/0081949 A1* | 6/2002 | Yoshida ............... C09K 3/1463 257/E21.244 |
| 2003/0228762 A1* | 12/2003 | Moeggenborg ... H01L 21/31053 257/E21.259 |
| 2010/0029181 A1* | 2/2010 | De Rege Thesauro ..................... H01L 21/3212 451/37 |

FOREIGN PATENT DOCUMENTS

| JP | 2001-007061 A | 1/2001 |
| JP | 2011-530166 A | 12/2011 |
| JP | 4872919 B | 2/2012 |
| JP | 2017-034264 A | 2/2017 |
| KR | 10-2011-0053438 A | 5/2011 |
| KR | 10-2013-0111558 A | 10/2013 |

(Continued)

*Primary Examiner* — Roberts P Culbert
(74) *Attorney, Agent, or Firm* — FITCH, EVEN, TABIN & FLANNERY, LLP

(57) ABSTRACT

A polishing liquid containing: abrasive grains; a first nitrogen-containing compound; a second nitrogen-containing compound; and water, in which the first nitrogen-containing compound contains at least one selected from the group consisting of (I) a compound having an aromatic ring containing one nitrogen atom in the ring and a hydroxyl group, (II) a compound having an aromatic ring containing one nitrogen atom in the ring and a functional group containing a nitrogen atom, (III) a compound having a 6-membered ring containing two nitrogen atoms in the ring, (IV) a compound having a benzene ring and a ring containing a nitrogen atom in the ring, and (V) a compound having a benzene ring to which two or more functional groups containing a nitrogen atom are bonded, and an HLB value of the second nitrogen-containing compound is 7 or more.

30 Claims, 2 Drawing Sheets

(56) References Cited

FOREIGN PATENT DOCUMENTS

| | | |
|---|---|---|
| TW | 201011826 A | 3/2010 |
| TW | 201516103 A | 5/2015 |
| WO | 2015/037311 A1 | 3/2015 |

\* cited by examiner (A)

(B)

POLISHING SOLUTION, POLISHING SOLUTION SET, POLISHING METHOD, AND DEFECT SUPPRESSING METHOD

CROSS-REFERENCE TO RELATED APPLICATIONS

This applicatiopn is a U.S. national phase application filed under 35 U.S.C. § 371 of International Application No. PCT/JP2019/014680, filed Apr. 2, 2019, designating the United States, which is hereby incorporated herein by reference in its entirety.

TECHNICAL FIELD

The present invention relates to a polishing liquid, a polishing liquid set, and a polishing method and a defect suppression method which use the polishing liquid or the polishing liquid set. More specifically, the present invention relates to a polishing liquid, a polishing liquid set, and a polishing method and a defect suppression method which use the polishing liquid or the polishing liquid set, which can be used in a flattening step of a base substrate surface, that is a production technique of a semiconductor element (particularly, a flattening step of interlayer insulating films, BPSG films (silicon dioxide films doped with boron and phosphorus), or the like; a formation step of shallow trench isolation (STI); and the like).

BACKGROUND ART

In current manufacturing processes of ULSI semiconductor elements, research and development of processing techniques for increasing the density and miniaturization of semiconductor elements have been conducted. A flattening technique by chemical mechanical polishing (CMP), that is one of the processing techniques, has become an essential technique when a flattening step of an interlayer insulating film or the like, an STI formation step, a plug formation step, an embedded metal wiring formation step (damascene step), and the like are performed in the manufacturing processes of semiconductor elements. The CMP step (the flattening step using the CMP technique) is generally performed by polishing a material to be polished of a base substrate while a polishing liquid for CMP is supplied between a polishing pad (polishing cloth) and the material to be polished.

In the CMP step, an insulating material is selectively polished using a stopper (a polishing stop layer containing a stopper material) in some cases. In this case, when the insulating material that is a material to be polished is polished to expose the stopper, the stopper is demanded to be stopped without being polished. As the stopper material, polysilicon, amorphous silicon, single-crystal silicon, and the like have been reviewed. In this case, as for the polishing liquid for CMP, it is demanded that a polishing rate of the stopper material is suppressed as much as possible and a polishing rate ratio of the insulating material with respect to the stopper material (polishing selectivity: the polishing rate of the insulating material/the polishing rate of the stopper material) is high (for example, see Patent Literature 1 described below).

CITATION LIST

Patent Literature

Patent Literature 1: Japanese Patent No. 4872919

SUMMARY OF INVENTION

Technical Problem

The stopper material is used, for example, as an electrically conductive material of semiconductor devices (a gate of a transistor, or the like) in some cases. In this case, after the CMP step, when defects (for example, recessed defects such as holes) based on chemical action occur in the stopper, since the reliability of semiconductor devices is considerably affected, it is demanded that the occurrence of defects in the stopper is suppressed as much as possible. However, with a further increase in density and further miniaturization of semiconductor elements, when defects occur in the stopper even in an extremely small amount, the performance of a semiconductor device is significantly deteriorated. On the other hand, in the technique of the related art, it is not easy to suppress the occurrence of defects in the stopper, and particularly, it is not easy to suppress the occurrence of defects in a stopper containing a silicon material (excluding silicon oxide) such as polysilicon, amorphous silicon, or single-crystal silicon.

An aspect of the present invention is made in order to solve the above problems, and an object thereof is to provide a polishing liquid and a polishing liquid set which can suppress the occurrence of defects in polishing of a surface to be polished containing a silicon material (excluding silicon oxide). Furthermore, an object of another aspect of the present invention is to provide a polishing method and a defect suppression method which use the polishing liquid or the polishing liquid set.

Solution to Problem

The present inventors have conducted intensive studies on constituent components of a polishing liquid in order to solve the above problems. As a result, the present inventors have found that the occurrence of defects in polishing of a surface to be polished containing a silicon material (excluding silicon oxide) can be suppressed by using specific two types of nitrogen-containing compounds.

An aspect of the present invention provides a polishing liquid containing: abrasive grains; a first nitrogen-containing compound; a second nitrogen-containing compound; and water, in which the first nitrogen-containing compound contains at least one selected from the group consisting of (I) a compound having an aromatic ring containing one nitrogen atom in the ring and a hydroxyl group, (II) a compound having an aromatic ring containing one nitrogen atom in the ring and a functional group containing a nitrogen atom, (III) a compound having a 6-membered ring containing two nitrogen atoms in the ring, (IV) a compound having a benzene ring and a ring containing a nitrogen atom in the ring, and (V) a compound having a benzene ring to which two or more functional groups containing a nitrogen atom are bonded, and an HLB value of the second nitrogen-containing compound is 7 or more.

According to such a polishing liquid, the occurrence of defects in polishing of a surface to be polished containing a silicon material (excluding silicon oxide) can be suppressed, and particularly, occurrence of defects based on chemical action can be suppressed.

Another aspect of the present invention provides a polishing liquid set containing constituent components of the aforementioned polishing liquid stored while being divided into a first liquid and a second liquid, the first liquid containing the abrasive grains and water, the second liquid containing the first nitrogen-containing compound, the second nitrogen-containing compound, and water.

Still another aspect of the present invention provides a polishing method including a step of polishing a surface to be polished by using the aforementioned polishing liquid or a polishing liquid obtained by mixing the first liquid and the second liquid of the aforementioned polishing liquid set.

Still another aspect of the present invention provides a defect suppression method suppressing occurrence of defects in polishing of a surface to be polished containing a stopper material, the method including a step of polishing a surface to be polished by using the aforementioned polishing liquid or a polishing liquid obtained by mixing the first liquid and the second liquid of the aforementioned polishing liquid set.

Advantageous Effects of Invention

According to an aspect of the present invention, it is possible to provide a polishing liquid and a polishing liquid set which can suppress the occurrence of defects in polishing of a surface to be polished containing a silicon material (excluding silicon oxide). Furthermore, according to another aspect of the present invention, it is possible to provide a polishing method and a defect suppression method which use the polishing liquid or the polishing liquid set. According to still another aspect of the present invention, it is possible to provide a use of the polishing liquid or the polishing liquid set to the defect suppression method suppressing the occurrence of defects in polishing of a surface to be polished containing a silicon material (excluding silicon oxide).

DESCRIPTION OF EMBODIMENTS

Figure 1:
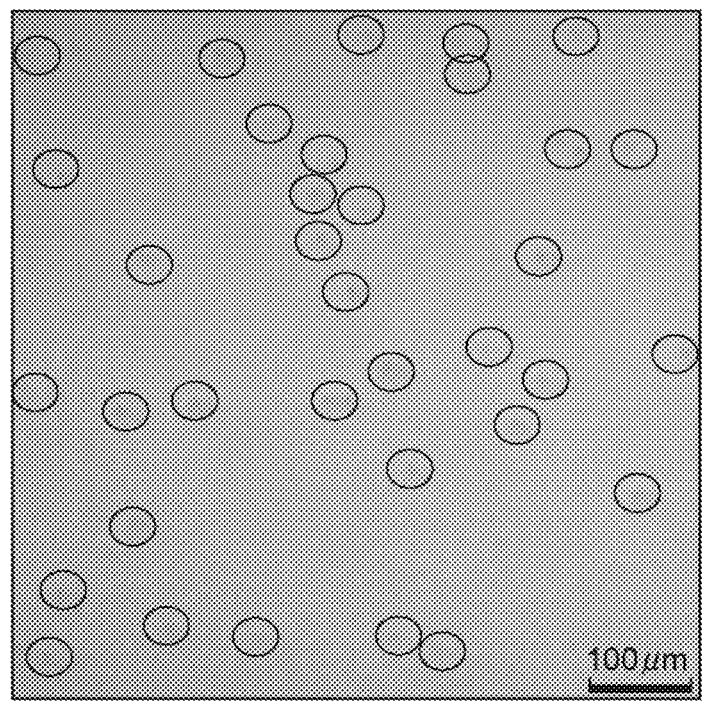
FIG. 1 is a view showing an example of defects.

Hereinafter, an embodiment of the present invention will be described in detail.

Definition

In the present specification, the term "step" includes not only an independent step but also a step by which an intended action of the step is achieved, though the step cannot be clearly distinguished from other steps. A numerical range that has been indicated by use of "to" indicates the range that includes the numerical values which are described before and after "to," as the minimum value and the maximum value, respectively. In the numerical ranges that are described stepwise in the present specification, the upper limit value or the lower limit value of the numerical range of a certain stage can be arbitrarily combined with the upper limit value or the lower limit value of the numerical range of another stage. In the numerical ranges that are described in the present specification, the upper limit value or the lower limit value of the numerical value range may be replaced with the value shown in the examples. Materials listed as examples in the present specification can be used singly or in combinations of two or more, unless otherwise specified. When a plurality of substances corresponding to each component exist in the composition, the content of each component in the composition means the total amount of the plurality of substances that exist in the composition, unless otherwise specified. "Polishing rate" means a rate at which the material is removed per unit time (Removal Rate). "A or B" may include either one of A and B, and may also include both of A and B. "A or more" in the numerical range means A and a range of more than A. "A or less" in the numerical range means A and a range of less than A.

The weight average molecular weight in the present specification can be measured by reading a value obtained as "Mw" according to the following method.

[Measuring Method]

Equipment used (detector): "L-3300 type" differential refractometer for liquid chromatograph manufactured by Hitachi, Ltd.

Pump: "L-7100" for liquid chromatograph manufactured by Hitachi, Ltd.

Degassing apparatus: None

Data processing: GPC integrator "D-2520" manufactured by Hitachi, Ltd.

Column: "Shodex Asahipak GF-710HQ" manufactured by Showa Denko K.K., inner diameter 7.6 mm×300 mm Eluent: 50 mM-$Na_2HPO_4$ aqueous solution/acetonitrile=90/10 (v/v)

Measurement temperature: 25° C.

Flow rate: 0.6 mL/min (L represents liter, same as below)

Measurement time: 30 min

Sample: sample prepared by adjusting a concentration with a solution having the same composition as the eluent so that the resin concentration becomes 2% by mass and filtering through a 0.45 μm polytetrafluoroethylene filter Injection amount: 0.4 μL Standard substance: narrow-molecular-weight sodium polyacrylate manufactured by Polymer Laboratories <Polishing Liquid>

A polishing liquid of the present embodiment (composition for polishing) contains abrasive grains, a first nitrogen-containing compound, a second nitrogen-containing compound, and water. The polishing liquid of the present embodiment contains at least a first nitrogen-containing compound and a second nitrogen-containing compound as an additive other than the abrasive grains and water. The polishing liquid of the present embodiment can be used as a polishing liquid for CMP.

According to the polishing liquid of the present embodiment, the occurrence of defects in polishing of a surface to be polished containing a silicon material (a material containing silicon; excluding silicon oxide; the same applies hereinafter) can be suppressed, and particularly, the occurrence of recessed defects can be suppressed. The recessed defect is, for example, as shown in FIG. 1, a recess (for example, a part indicated by a circle in FIG. 1) such as a hole generated on a polished surface after polishing, and occurs based on chemical action. Examples of the silicon material include polysilicon (polycrystalline silicon), amorphous silicon (non-crystalline silicon), and single-crystal silicon.

Incidentally, when the constituent components of the polishing liquid are not sufficiently dispersed and mixed in the polishing liquid so that liquid layer isolation occurs, stable properties of the polishing liquid is hardly obtained. On the other hand, according to the polishing liquid of the present embodiment, the occurrence of defects in polishing of a surface to be polished containing a silicon material can be suppressed while the occurrence of liquid layer isolation of the constituent components (for example, the second nitrogen-containing compound) of the polishing liquid is suppressed.

The polishing liquid of the present embodiment can be used in polishing using a silicon material as a stopper material. The polishing liquid of the present embodiment can be used, for example, for inhibiting the polishing of at least one selected from the group consisting of polysilicon, amorphous silicon, and single-crystal silicon.

The surface to be polished may contain other materials to be polished (an insulating material, a metal material other than the silicon material, a coating-type organic material, or the like) in addition to a silicon material. Examples of the insulating material include insulating materials used in an interlayer insulating film, a BPSG film, or an STI film. The polishing liquid of the present embodiment may be used for polishing an insulating material, and for example, may be used in polishing of removing at least a part of an insulating material by CMP to expose a stopper containing a silicon material. According to the polishing liquid of the present embodiment, it is possible to suppress the occurrence of defects in the polishing step in which polishing is stopped when a stopper is exposed by polishing an insulating material.

Incidentally, when an insulating material remains on a stopper, the reliability of a semiconductor device deteriorates in some cases. On the other hand, the polishing liquid of the present embodiment may be used in a polishing step of further polishing after the stopper is exposed, and may be used in a polishing step of exposing the entire portion, which is coated with an insulating material, of a stopper by further polishing after the stopper is exposed. According to the polishing liquid of the present embodiment, it is possible to suppress the occurrence of defects even in the case of using the polishing liquid in these polishing steps.

(Abrasive Grains)

The polishing liquid of the present embodiment contains abrasive grains (abrasive particles). Examples of the constituent components of the abrasive grains include at least one selected from the group consisting of a cerium compound, silica (silicon oxide), alumina (aluminum oxide), zirconia, titania, germania, manganese oxide, magnesium oxide, resins, diamond, silicon carbide, cubic boron nitride, and modified products thereof. The particles containing the above-described modified products may be particles obtained by modifying surfaces of particles with an alkyl group; composite particles obtained by attaching other particles to surfaces of particles, and the like. As particles containing alumina, colloidal alumina can be used. The abrasive grains may be used singly or in combination of two or more kinds thereof.

The abrasive grains preferably contain a cerium compound from the viewpoint of easily obtaining a favorable polishing rate of an insulating material. Examples of the cerium compound include cerium oxide (ceria), cerium hydroxide, cerium ammonium nitrate, cerium acetate, cerium sulfate hydrate, cerium bromate, cerium bromide, cerium chloride, cerium oxalate, cerium nitrate, and cerium carbonate. From the viewpoint that the polishing rate of an insulating material is stabilized, the abrasive grains preferably contain at least one selected from the group consisting of cerium oxide and cerium hydroxide and more preferably contain cerium oxide. As abrasive grains containing a cerium compound, cerium oxide particles (particles containing cerium oxide), cerium hydroxide particles (particles containing cerium hydroxide), or the like can be used. As the cerium oxide particles, colloidal ceria can also be used.

In the case of using the cerium oxide particles, as the crystallite diameter (diameter of crystallites) of the cerium oxide particles is large and crystal distortion is small, high-speed polishing is possible, but polishing scratches tend to be easily generated on a material to be polished. From the above viewpoint, as preferred cerium oxide particles, particles composed of two or more crystallites and having crystal grain boundaries, and the like are exemplified. Furthermore, as other preferred cerium oxide particles, for example, colloidal ceria particles having a crystallite diameter of 5 to 300 nm (for example, colloidal ceria manufactured by Rhodia) are exemplified.

In a case where the abrasive grains contain cerium oxide, the content of the cerium oxide in the abrasive grains is preferably 50% by mass or more, more preferably 70% by mass or more, further preferably 90% by mass or more, particularly preferably 95% by mass or more, extremely preferably 97% by mass or more, and highly preferably 99% by mass or more, based on the whole of the abrasive grains (the whole of the abrasive grains contained in the polishing liquid; the same applies hereinafter), from the viewpoint of easily obtaining a favorable polishing rate of an insulating material. Regarding the abrasive grains containing cerium oxide, an embodiment in which the abrasive grains are substantially composed of cerium oxide (an embodiment in which substantially 100% by mass of the abrasive grains is cerium oxide) may be employed.

The abrasive grains may be abrasive grains obtained by any producing method. For example, as the method of producing an oxide, a solid phase method using firing or the like; a liquid phase method such as a precipitation method, a sol-gel method, or a hydrothermal synthesis method; a gas phase method such as a sputtering method, a laser method, or a thermal plasma method, and the like can be used.

The cerium oxide particles are preferably obtained by oxidizing cerium salts such as carbonates, nitrates, sulfates, and oxalates. Examples of the oxidation method include a firing method in which a cerium salt is fired at about 600° C. to 900° C., and a chemical oxidation method in which a cerium salt is oxidized using an oxidizing agent such as hydrogen peroxide. As the method for producing the cerium oxide particles, the firing method is preferred from the viewpoint of easily obtaining a high polishing rate of an insulating material, and the chemical oxidation method is preferred from the viewpoint that polishing scratches hardly occur on the polished surface after polishing.

In a case where the abrasive grains are aggregated, the aggregated abrasive grains may be subjected to mechanical pulverization. As a pulverization method, for example, a dry pulverization method using a jet mill or the like and a wet pulverization method using a planetary bead mill or the like are preferred. For the jet mill, for example, a method described in "Kagaku Kougaku Ronbunshu (Collection of chemical engineering papers)," Vol. 6, No. 5, (1980), pp. 527 to 532 can be applied.

The polishing liquid can be obtained by dispersing the abrasive grains in water that is a dispersing medium. As a dispersion method, for example, in addition to a dispersion treatment by a general stirrer, methods using a homogenizer, an ultrasonic dispersing machine, a wet ball mill, and the like are exemplified. As for the dispersion method and a particle size controlling method, for example, methods described in Chapter 3 "Latest development trend and selection guidelines for various dispersing machines" of "Encyclopedia of Dispersion Technology" [Johokiko Co., Ltd., July 2005] can be used. Furthermore, the dispersibility of the abrasive grains can also be increased by lowering an electric conductivity of the dispersion containing the abrasive grains (for example, 500 mS/m or less). Examples of the method of lowering the electric conductivity of the dispersion include a method in which solid-liquid separation is performed by centrifugal separation or the like in order to separate the abrasive grains from the dispersing medium, the supernatant liquid (dispersing medium) is discarded, and then redispersion is performed by addition of a dispersing medium having a low electric conductivity; and a method using ultrafiltration, an ion exchange resin, or the like.

The abrasive grains dispersed by the above method may be further micronized. As the micronizing method, for example, a precipitating classification method (a method in which the abrasive grains are subjected to centrifugal separation by a centrifugal separator and then forcibly precipitated, and the only supernatant liquid is removed) is exemplified. Further, a high-pressure homogenizer in which the abrasive grains collide with each other in the dispersing medium by high pressure may be used.

The average particle size of the abrasive grains is preferably 10 nm or more, more preferably 20 nm or more, further preferably 50 nm or more, particularly preferably 90 nm or more, extremely preferably more than 90 nm, highly preferably 100 nm or more, even more preferably 130 nm or more, and further preferably 150 nm or more, from the viewpoint of easily obtaining a favorable polishing rate of an insulating material. The average particle size of the abrasive grains is preferably 500 nm or less, more preferably 400 nm or less, further preferably 300 nm or less, and particularly preferably 200 nm or less, from the viewpoint that scratches are less likely to be generated in a material to be polished. From these viewpoints, the average particle size of the abrasive grains is preferably 10 to 500 nm, more preferably 20 to 400 nm, further preferably 50 to 300 nm, particularly preferably 90 to 300 nm, extremely preferably more than 90 nm and 300 nm or less, highly preferably 100 to 300 nm, even more preferably 130 to 300 nm, and further preferably 150 to 200 nm.

The average particle size of the abrasive grains means, for example, the D50 value (the average secondary particle size; the median diameter of the volume distribution; the cumulative median) of the measurement sample measured using a laser diffraction type particle size distribution meter (trade name: LA-920, manufactured by HORIBA, Ltd., refractive index: 1.93, light source: He—Ne laser, absorption: 0). In measurement of the average particle size, a measurement sample having an appropriate content (for example, a content at which a transmittance (H) becomes 60 to 70% as measured with respect to He—Ne laser) can be used. Furthermore, in the case of storing the polishing liquid containing the abrasive grains while being divided into a slurry in which the abrasive grains are dispersed in water, and an additive liquid containing an additive, the measurement can be carried out by diluting the slurry to an appropriate content.

The content of the abrasive grains is preferably in the following range based on the total mass of the polishing liquid. The content of the abrasive grains is preferably 0.01% by mass or more, more preferably 0.05% by mass or more, further preferably 0.1% by mass or more, particularly preferably 0.2% by mass or more, extremely preferably 0.4% by mass or more, and highly preferably 0.5% by mass or more, from the viewpoint of easily securing a sufficient polishing rate of an insulating material. The content of the abrasive grains is preferably 20% by mass or less, more preferably 10% by mass or less, further preferably 5% by mass or less, particularly preferably 3% by mass or less, and extremely preferably 1% by mass or less, from the viewpoint of easily suppressing the aggregation of the abrasive grains. From these viewpoints, the content of the abrasive grains is preferably 0.01 to 20% by mass, more preferably 0.05 to 10% by mass, further preferably 0.1 to 5% by mass, particularly preferably 0.2 to 3% by mass, extremely preferably 0.2 to 1% by mass, highly preferably 0.4 to 1% by mass, and even more preferably 0.5 to 1% by mass.

(Additive)

[First Nitrogen-Containing Compound]

The polishing liquid of the present embodiment contains a first nitrogen-containing compound. The first nitrogen-containing compound can act as a defect inhibitor. The first nitrogen-containing compound contains at least one selected from the group consisting of (I) a compound having an aromatic ring containing one nitrogen atom in the ring and a hydroxyl group (hereinafter, referred to as "compound (I)"), (II) a compound having an aromatic ring containing one nitrogen atom in the ring and a functional group containing a nitrogen atom (excluding a compound corresponding to the compound (I); hereinafter, referred to as "compound (II)"), (III) a compound having a 6-membered ring containing two nitrogen atoms in the ring (excluding a compound corresponding to the compound (I) or the compound (II); hereinafter, referred to as "compound (III)"), (IV) a compound having a benzene ring and a ring containing a nitrogen atom in the ring (excluding a compound corresponding to the compound (I), the compound (II), or the compound (III); hereinafter, referred to as "compound (IV)"), and (V) a compound having a benzene ring to which two or more functional groups containing a nitrogen atom are bonded (excluding a compound corresponding to the compound (I), the compound (II), the compound (III), or the compound (IV); hereinafter, referred to as "compound (V)"). The molecular weight of the first nitrogen-containing compound may be, for example, less than 200. The first nitrogen-containing compound may be used singly or in combination of two or more kinds thereof.

The number of nitrogen atoms in one molecule of the first nitrogen-containing compound is preferably 1 to 4 and more preferably 1 to 3, from the viewpoint of further suppressing the occurrence of defects. The number of the nitrogen atoms may be 2 or more.

The compound (I) is a compound having an aromatic ring containing one nitrogen atom in the ring and a hydroxyl group. It is speculated that the surface of the silicon material is suitably protected by a coordination bond between a vacant orbital of the nitrogen atom in the ring of the compound (I) and an unshared electron pair of the oxygen atom of the hydroxyl group in the silicon material or a hydrogen bond between the hydroxyl group of the compound (I) and the hydroxyl group of the silicon material. Incidentally, OH of the carboxyl group (COOH group) is not included in the hydroxyl group of the compound (I). The hydrogen bonding property of OH of the carboxyl group is speculated to be lower than that of the hydroxyl group.

Examples of the aromatic ring include a 3-membered ring, a 4-membered ring, a 5-membered ring, and a 6-membered ring, and from the viewpoint of further suppressing the occurrence of defects, a 6-membered ring is preferred. The aromatic ring is, for example, a heteroaromatic ring. Examples of the aromatic ring containing one nitrogen atom in the ring include an azole ring, a pyridine ring, an oxazole ring, a thiazole ring, a thiazine ring, and from the viewpoint of further suppressing the occurrence of defects, a pyridine ring is preferred.

The hydroxyl group of the compound (I) may be a hydroxyl group which is bonded directly to the aromatic ring and may be a hydroxyl group which is not bonded directly to the aromatic ring. The compound (I) preferably has a hydroxyl group which is bonded directly to an aromatic ring, from the viewpoint of further suppressing the occurrence of defects. The number of hydroxyl groups is preferably 1 to 3, more preferably 1 or 2, and further preferably 1, from the viewpoint of further suppressing the occurrence of defects. The hydroxyl group is preferably bonded to a carbon atom adjacent to the nitrogen atom contained in the aromatic ring, from the viewpoint of further suppressing the occurrence of defects.

As the compound (I), hydroxypyridine is preferred from the viewpoint of further suppressing the occurrence of defects. Examples of the hydroxypyridine include 2-hydroxypyridine, 3-hydroxypyridine, and 4-hydroxypyridine.

The compound (II) is a compound having an aromatic ring containing one nitrogen atom in the ring and a functional group containing a nitrogen atom. It is speculated that the surface of the silicon material is suitably protected by a coordination bond between a vacant orbital of the nitrogen atom in the ring of the compound (II) and an unshared electron pair of the oxygen atom of the hydroxyl group in the silicon material or a hydrogen bond between the functional group containing a nitrogen atom of the compound (II) and the hydroxyl group of the silicon material.

Examples of the aromatic ring include a 3-membered ring, a 4-membered ring, a 5-membered ring, and a 6-membered ring, and from the viewpoint of further suppressing the occurrence of defects, a 6-membered ring is preferred. The aromatic ring is, for example, a heteroaromatic ring. Examples of the aromatic ring containing one nitrogen atom in the ring include an azole ring, a pyridine ring, an oxazole ring, a thiazole ring, a thiazine ring, and from the viewpoint of further suppressing the occurrence of defects, a pyridine ring is preferred.

Examples of the functional group containing a nitrogen atom include an amino group, an amide group, and a sulfonamide group, and from the viewpoint of further suppressing the occurrence of defects, at least one selected from the group consisting of an amino group and an amide group is preferred. The functional group containing a nitrogen atom may be a functional group which is bonded directly to the aromatic ring and may be a functional group which is not bonded directly to the aromatic ring. The compound (II) preferably has a functional group which is bonded directly to an aromatic ring, as the functional group containing a nitrogen atom, from the viewpoint of further suppressing the occurrence of defects. The number of functional groups containing a nitrogen atom is preferably 1 to 3, more preferably 1 or 2, and further preferably 1, from the viewpoint of further suppressing the occurrence of defects. The functional group containing a nitrogen atom is preferably bonded to a carbon atom located at the 2-position or the 3-position with respect to a nitrogen atom located at the 1-position contained in the aromatic ring, from the viewpoint of further suppressing the occurrence of defects.

As the compound (II), from the viewpoint of further suppressing the occurrence of defects, at least one selected from the group consisting of aminopyridine, picolinamide, and nicotinamide is preferred. Examples of the aminopyridine include 2-aminopyridine, 3-aminopyridine, and 4-aminopyridine.

The compound (III) is a compound having a 6-membered ring containing two nitrogen atoms in the ring. It is speculated that the surface of the silicon material is suitably protected by a coordination bond between a vacant orbital of the nitrogen atom in the ring of the compound (III) and an unshared electron pair of the oxygen atom of the hydroxyl group in the silicon material at two sites. It is speculated that, in a compound having a 5-membered ring (pyrazole or the like), since the nitrogen atom having a vacant orbital and the nitrogen atom having an unshared electron pair are mixedly present and are adjacent to each other, the coordination bonding property and the hydrogen bonding property are weak. Also, it is speculated that, in a case where the 6-membered ring contains three or more nitrogen atoms in the ring, since the nitrogen atom having a vacant orbital and the nitrogen atom having an unshared electron pair are mixedly present and are adjacent to each other, the coordination bonding property and the hydrogen bonding property are weak.

Examples of the 6-membered ring include an aromatic ring and a non-aromatic ring, and from the viewpoint of further suppressing the occurrence of defects, an aromatic ring is preferred. The aromatic ring is, for example, a heteroaromatic ring. As the 6-membered ring containing two nitrogen atoms in the ring, a pyrazine ring is preferred.

In the compound (III), the number of functional groups containing a nitrogen atom is preferably 1 or less, from the viewpoint of further suppressing the occurrence of defects. Examples of the functional group containing a nitrogen atom include an amino group, an amide group, and a sulfonamide group. In the functional group containing a nitrogen atom, a 6-membered ring containing two nitrogen atoms in the ring is not included.

Examples of the compound (III) include pyrazine, pyrazinamide, 2,5-dimethylpyrazine, 2,3-dimethylpyrazine, 2,3-diethylpyrazine, and 2,3,5,6-tetramethylpyrazine, and from the viewpoint of further suppressing the occurrence of defects, at least one selected from the group consisting of pyrazine, pyrazinamide, 2,5-dimethylpyrazine, 2,3-dimethylpyrazine, and 2,3,5,6-tetramethylpyrazine is preferred.

The compound (IV) is a compound having a benzene ring and a ring containing a nitrogen atom in the ring. It is speculated that the surface of the silicon material is suitably protected by strengthening the coordination bonding property between a vacant orbital of the nitrogen atom in the ring of the compound (IV) and an unshared electron pair of the oxygen atom of the hydroxyl group in the silicon material by the electron-withdrawing property of the benzene ring in the compound (IV).

Examples of the ring containing a nitrogen atom in the ring include a 3-membered ring, a 4-membered ring, a 5-membered ring, and a 6-membered ring, and from the viewpoint of further suppressing the occurrence of defects, a 5-membered ring is preferred. The ring containing a nitrogen atom in the ring may be an aromatic ring or a non-aromatic ring. Examples of the ring containing a nitrogen atom in the ring include a pyridine ring, an azole ring, a triazole ring, an imidazole ring, a pyrazole ring, an oxazole ring, a thiazole ring, a pyrazine ring, a thiazine ring, an azepine ring, a pyrrolidine ring, a piperidine ring, an imidazoline ring, a morpholine ring, a pyrazoline ring, and a pyrazolone ring, and from the viewpoint of further suppressing the occurrence of defects, at least one selected from the group consisting of a triazole ring and a pyrazolone ring is preferred. The number of nitrogen atoms in the ring containing a nitrogen atom in the ring is preferably 2 or more, from the viewpoint of further suppressing the occurrence of defects. The number of nitrogen atoms in the ring containing a nitrogen atom in the ring is preferably 4 or less and more preferably 3 or less, from the viewpoint of further suppressing the occurrence of defects. The benzene ring and the ring containing a nitrogen atom in the ring may share a carbon atom constituting the ring or may not share the carbon atom.

As the compound (IV), from the viewpoint of further suppressing the occurrence of defects, at least one selected from the group consisting of benzotriazole and 1-phenyl-3-pyrazolidone is preferred.

The compound (V) is a compound having a benzene ring to which two or more functional groups containing a nitrogen atom are bonded. It is speculated that the surface of the silicon material is suitably protected by forming a hydrogen bond between the functional group containing a nitrogen atom of the compound (V) and the hydroxyl group of the silicon material and by strengthening the hydrogen bond by the electron-withdrawing property of the benzene ring in the compound (V). In a case where the functional group containing a nitrogen atom is one, it is speculated that the hydrogen bond is not sufficiently strengthened by the electron-withdrawing property of the benzene ring.

As a substituent, two or more functional groups containing a nitrogen atom are bonded directly to the benzene ring. As the functional group containing a nitrogen atom, from the viewpoint of further suppressing the occurrence of defects, at least one selected from the group consisting of an amino group, an amide group, and a sulfonamide group is preferred. The number of functional groups containing a nitrogen atom is preferably 2 to 4, more preferably 2 or 3, and further preferably 2, from the viewpoint of further suppressing the occurrence of defects. Regarding the disposition of the functional group containing a nitrogen atom, from the viewpoint of further suppressing the occurrence of defects, another functional group with respect to one functional group is preferably located at the para position of the benzene ring.

As the compound (V), from the viewpoint of further suppressing the occurrence of defects, at least one selected from the group consisting of sulfanilamide and p-aminobenzoic acid amide is preferred. The compound (V) may contain a compound not having a sulfonamide group. The compound (V) may not contain a compound not having a sulfonamide group.

From the viewpoint of further suppressing the occurrence of defects, the first nitrogen-containing compound preferably contains at least one selected from the group consisting of the compound (II), the compound (III), and the compound (IV), more preferably contains at least one selected from the group consisting of the compound (II) and the compound (III), and further preferably contains at least one selected from the group consisting of nicotinamide, aminopyridine, and pyrazinamide. From the viewpoint of further suppressing the occurrence of defects, the first nitrogen-containing compound preferably has an embodiment containing the compound (II), an embodiment containing the compound (III), or an embodiment containing the compound (IV), more preferably has an embodiment containing the compound (II) or an embodiment containing the compound (III), and further preferably an embodiment containing nicotinamide, an embodiment containing aminopyridine, or an embodiment containing pyrazinamide.

The content of the first nitrogen-containing compound is preferably in the following range based on the total mass of the polishing liquid. The content of the first nitrogen-containing compound is preferably 0.001% by mass or more, more preferably 0.005% by mass or more, further preferably 0.01% by mass or more, particularly preferably 0.03% by mass or more, extremely preferably 0.05% by mass or more, highly preferably 0.07% by mass or more, and even more preferably 0.1% by mass or more, from the viewpoint of easily and sufficiently obtaining a defect suppressing effect. The content of the first nitrogen-containing compound is preferably 10% by mass or less, more preferably 5% by mass or less, further preferably 3% by mass or less, particularly preferably 1% by mass or less, extremely preferably 0.5% by mass or less, highly preferably 0.3% by mass or less, even more preferably 0.2% by mass or less, and further preferably 0.1% by mass or less, from the viewpoint of easily securing a sufficient polishing rate of an insulating material. From these viewpoints, the content of the first nitrogen-containing compound is preferably 0.001 to 10% by mass.

[Second Nitrogen-Containing Compound]

The polishing liquid of the present embodiment contains a second nitrogen-containing compound (excluding a compound corresponding to the first nitrogen-containing compound). The HLB value of the second nitrogen-containing compound is 7 or more from the viewpoint of sufficiently obtaining a defect suppressing effect. The second nitrogen-containing compound can act as a defect inhibitor suppressing defects that are not suppressed only by the first nitrogen-containing compound. Furthermore, the second nitrogen-containing compound may have an effect of suppressing the polishing rate of a stopper material in addition to an effect of suppressing defects. The second nitrogen-containing compound may contain a nitrogen-containing polymer compound. The molecular weight (for example, the weight average molecular weight) of the second nitrogen-containing compound may be, for example, 200 or more.

According to the polishing liquid of the present embodiment, by using the first nitrogen-containing compound and the second nitrogen-containing compound, the occurrence of defects in polishing of a surface to be polished containing a silicon material can be suppressed, and particularly, the occurrence of defects based on chemical action can be suppressed. The specific reason why such an effect is exhibited is not necessarily clear, but the present inventors speculate an example of the reason in the following way. That is, a hydroxyl group is present on the surface of a silicon material such as polysilicon, amorphous silicon, and single-crystal silicon. In this case, by using, as the first nitrogen-containing compound, a compound which can form a hydrogen bond or a coordination bond with at least two or more hydroxyl groups of a silicon material or a compound which can strengthen a hydrogen bond or a coordination bond with a hydroxyl group of a silicon material, the surface of the silicon material is suitably protected. Furthermore, it is speculated that such an action is sufficiently exhibited by using the first nitrogen-containing compound in the presence of the second nitrogen-containing compound that is easily dispersed and mixed in the polishing liquid, and thus the occurrence of defects is suppressed.

The HLB value of the second nitrogen-containing compound is preferably 8 or more, more preferably 8.5 or more, further preferably 9 or more, particularly preferably 9.5 or more, and extremely preferably 10 or more, from the viewpoint that the second nitrogen-containing compound is easily dispersed and mixed in the polishing liquid so that stable properties are easily obtained. The HLB value of the second nitrogen-containing compound may be 11 or more, 11.5 or more, 12 or more, 12.5 or more, or 13 or more. The HLB value of the second nitrogen-containing compound may be 20 or less, 19 or less, 18 or less, 17 or less, 16 or less, 15 or less, 14.5 or less, 14 or less, or 13.5 or less. The HLB value of the second nitrogen-containing compound may be 7 to 20.

The second nitrogen-containing compound preferably has a hydrocarbon group bonded to a nitrogen atom from the viewpoint of easily and sufficiently obtaining a defect suppressing effect. Examples of the hydrocarbon group include a saturated hydrocarbon group (an alkyl group) and an unsaturated hydrocarbon group. The number of carbon atoms of the hydrocarbon group is preferably 3 or more, more preferably 6 or more, further preferably 9 or more, particularly preferably 10 or more, and extremely preferably 12 or more, from the viewpoint of easily and sufficiently obtaining a defect suppressing effect. The number of carbon atoms of the hydrocarbon group is preferably 30 or less, more preferably 24 or less, further preferably 21 or less, and particularly preferably 18 or less, from the viewpoint of easily suppressing the aggregation of the abrasive grains. From these viewpoints, the number of carbon atoms of the hydrocarbon group is preferably 3 to 30. The number of carbon atoms of the hydrocarbon group may be 15 or more or 18 or more.

The second nitrogen-containing compound preferably contains amine and more preferably contains polyetheramine, from the viewpoint of easily and sufficiently obtaining a defect suppressing effect. The amine preferably has a polyoxyalkylene group from the viewpoint of easily and sufficiently obtaining a defect suppressing effect. As the polyoxyalkylene group, from the viewpoint of easily and sufficiently obtaining a defect suppressing effect, a polyoxyethylene group is preferred. The second nitrogen-containing compound preferably contains a compound having one or two polyoxyalkylene groups bonded to a nitrogen atom (the same nitrogen atom) and more preferably contains a compound having one or two polyoxyethylene groups bonded to a nitrogen atom (the same nitrogen atom), from the viewpoint of easily and sufficiently obtaining a defect suppressing effect.

Examples of polyetheramine include polyoxyethylene alkylamine (such as polyoxyethylene oleylamine, polyoxyethylene laurylamine, polyoxyethylene stearylamine, polyoxyethylene beef tallow alkylamine, or polyoxyethylene alkyl (coconut) amine), polyoxyethylene polyoxypropylene laurylamine, and polyoxyethylene alkylpropylenediamine. The second nitrogen-containing compound preferably contains at least one selected from the group consisting of polyoxyethylene alkylamine and polyoxyethylene alkylpropylenediamine and more preferably contains at least one selected from the group consisting of polyoxyethylene oleylamine, polyoxyethylene laurylamine, polyoxyethylene stearylamine, polyoxyethylene beef tallow alkylamine, and polyoxyethylene alkylpropylenediamine, from the viewpoint of easily and sufficiently obtaining a defect suppressing effect.

The second nitrogen-containing compound may contain an alkanolamide compound (a compound having a hydroxy group and an amide group in an alkane skeleton). The alkanolamide compound may contain an alkanolamide alkylene oxide adduct (for example, an alkanolamide ethylene oxide adduct) and may contain an alkanolamide alkylene oxide adduct having a polyoxyalkylene group (for example, a polyoxyethylene group) bonded to a nitrogen atom constituting an amide group.

The second nitrogen-containing compound preferably contains a compound represented by General Formula (X) below from the viewpoint of easily and sufficiently obtaining a defect suppressing effect. The second nitrogen-containing compound preferably contains a compound in which one or two of $R^1$, $R^2$, and $R^3$ in General Formula (X) are a polyoxyalkylene group and more preferably contains a compound in which one or two of $R^1$, $R^2$, and $R^3$ in General Formula (X) are a polyoxyethylene group, from the viewpoint of easily and sufficiently obtaining a defect suppressing effect.

[Chemical Formula 1]

(X)

[In the formula, $R^1$, $R^2$, and $R^3$ each independently represent a polyoxyalkylene group or a hydrocarbon group which may have a substituent].

Examples of the polyoxyalkylene group include a polyoxyethylene group and a polyoxypropylene group. As the polyoxyalkylene group, from the viewpoint of easily and sufficiently obtaining a defect suppressing effect, a polyoxyethylene group is preferred.

Examples of the hydrocarbon group include a saturated hydrocarbon group (an alkyl group) and an unsaturated hydrocarbon group. The number of carbon atoms of the hydrocarbon group is preferably the number of carbon atoms that is mentioned above regarding the hydrocarbon group bonded to a nitrogen atom, from the viewpoint of easily and sufficiently obtaining a defect suppressing effect. Examples of the substituent of the hydrocarbon group include a hydroxy group, a carboxyl group, an amino group, and a substituted amino group. The substituted amino group may be a secondary amino group or a tertiary amino group. Examples of the substituent of the substituted amino group include a hydrocarbon group (for example, an alkyl group) and a polyoxyalkylene group (for example, a polyoxyethylene group). Examples of the substituted amino group include a group in which one hydrocarbon group (for example, an alkyl group) and one polyoxyalkylene group (for example, a polyoxyethylene group) are bonded to a nitrogen atom constituting an amino group, and a group in which two polyoxyalkylene groups (for example, polyoxyethylene groups) are bonded to a nitrogen atom constituting an amino group.

The content of the second nitrogen-containing compound is preferably 0.0001% by mass or more, more preferably 0.0003% by mass or more, further preferably 0.0005% by mass or more, particularly preferably 0.0008% by mass or more, extremely preferably 0.001% by mass or more, highly preferably 0.002% by mass or more, even more preferably 0.003% by mass or more, further preferably 0.004% by mass or more, particularly preferably 0.005% by mass or more, extremely preferably 0.008% by mass or more, and highly preferably 0.01% by mass or more, from the viewpoint of easily and sufficiently obtaining a defect suppressing effect. The content of the second nitrogen-containing compound is preferably 1.0% by mass or less, more preferably 0.5% by mass or less, further preferably 0.1% by mass or less, particularly preferably 0.05% by mass or less, extremely preferably 0.03% by mass or less, and highly preferably 0.01% by mass or less, from the viewpoint of easily suppressing the aggregation of the abrasive grains. From these viewpoints, the content of the second nitrogen-containing compound is preferably 0.0001 to 1.0% by mass. The content of the second nitrogen-containing compound may be less than 0.01% by mass, 0.008% by mass or less, 0.005% by mass or less, less than 0.005% by mass, 0.003% by mass or less, or 0.001% by mass or less.

[Polymer Compound (A)]

The polishing liquid of the present embodiment can contain a polymer compound (A) having at least one selected from the group consisting of a carboxylic acid group and a carboxylate group (excluding a compound corresponding to the first nitrogen-containing compound or the second nitrogen-containing compound). By using the polymer compound (A), dishing can be suppressed.

The polymer compound (A) may be used singly or in combination of two or more kinds thereof. The polymer compound (A) preferably contains a polymer or a salt thereof wherein the polymer is obtained by polymerizing a monomer containing at least one selected from the group consisting of acrylic acid and methacrylic acid (hereinafter, these are collectively referred to as "(meth)acrylic acid-based polymer"). The monomer may include other monomer (excluding acrylic acid and methacrylic acid) copolymerizable with acrylic acid or methacrylic acid.

The polymer compound (A) may be at least one selected from the group consisting of a homopolymer of acrylic acid (polyacrylic acid), a homopolymer of methacrylic acid (polymethacrylic acid), a copolymer of acrylic acid and methacrylic acid, a copolymer of acrylic acid or methacrylic acid with other monomer, a copolymer of acrylic acid, methacrylic acid, and other monomer, and salts thereof. Among them, as the (meth)acrylic acid-based polymer, from the viewpoint of obtaining favorable adsorption to a stopper material, at least one selected from the group consisting of a homopolymer of acrylic acid (polyacrylic acid) and a salt thereof is preferred. As the salt of the polymer (a polymer having a carboxylate group), an ammonium salt and the like are exemplified. As the ammonium salt, ammonium polyacrylate and the like are exemplified. The (meth)acrylic acid-based polymer may be used singly or in combination of two or more kinds thereof.

Examples of the other monomers (other monomers copolymerizable with acrylic acid or methacrylic acid) include an unsaturated carboxylic acid such as crotonic acid, pentenoic acid, hexenoic acid, heptenoic acid, octenoic acid, nonenoic acid, decenoic acid, undecenoic acid, dodecenoic acid, tridecenoic acid, tetradecenoic acid, pentadecenoic acid, hexadecenoic acid, or heptadecenoic acid; and a vinyl compound such as ethylene, propylene, or styrene.

The weight average molecular weight of the polymer compound (A) is preferably in the following range. The weight average molecular weight of the polymer compound (A) is preferably 100 or more, more preferably 1000 or more, further preferably 2000 or more, and particularly preferably 2500 or more, from the viewpoint that there is a tendency that a favorable polishing rate is easily obtainable when an insulating material (silicon oxide or the like) is polished. The weight average molecular weight of the polymer compound (A) is preferably 150000 or less, more preferably 80000 or less, further preferably 10000 or less, particularly preferably 7000 or less, and extremely preferably 5000 or less, from the viewpoint that there is a tendency that the storage stability of the polishing liquid is difficult to decrease. From these viewpoints, the weight average molecular weight of the polymer compound (A) is preferably 100 to 150000, more preferably 1000 to 80000, further preferably 1000 to 10000, particularly preferably 2000 to 7000, and extremely preferably 2500 to 5000.

The content of the polymer compound (A) is preferably in the following range based on the total mass of the polishing liquid. The content of the polymer compound (A) is preferably 0.001% by mass or more, more preferably 0.01% by mass or more, and further preferably 0.1% by mass or more, from the viewpoints of easily decreasing a dishing amount or the like and easily and sufficiently securing surface flatness. The content of the polymer compound (A) is preferably 2% by mass or less, more preferably 1% by mass or less, further preferably 0.5% by mass or less, and particularly preferably 0.3% by mass or less, from the viewpoint of easily suppressing that the storage stability of the abrasive grains is decreased so that the aggregation of the abrasive grains, or the like, easily occurs. From these viewpoints, the content of the polymer compound (A) is preferably 0.001 to 2% by mass, more preferably 0.01 to 1% by mass, further preferably 0.1 to 0.5% by mass, and particularly preferably 0.1 to 0.3% by mass.

[Polymer Compound (B): Nonionic Polymer Compound]

The polishing liquid of the present embodiment may contain a nonionic polymer compound (B) (excluding a compound corresponding to the first nitrogen-containing compound, the second nitrogen-containing compound, or the polymer compound (A)). The polymer compound (B) can function as a stopper material polishing inhibitor that suppresses the polishing of a stopper material. By using the polymer compound (B), an excellent polishing rate ratio of an insulating material with respect to a stopper material can be obtained.

Examples of the polymer compound (B) include polyalkylene glycol; polyoxyalkylene derivative; polyglycerol; a vinyl alcohol polymer; polyvinylpyrrolidone and a copolymer having a structure unit derived from vinylpyrrolidone; and other water-soluble nonionic compounds. The polymer compound (B) may be used singly or in combination of two or more kinds thereof.

Examples of the polyalkylene glycol include polyethylene glycol and polypropylene glycol.

Examples of the polyoxyalkylene derivative include a compound in which a functional group and/or a substituent is introduced into polyalkylene glycol, and a compound in which polyalkylene oxide is added to an organic compound. Examples of the functional group and the substituent include alkyl ether, alkyl phenyl ether, phenyl ether, styrenated phenyl ether, fatty acid ester, glycol ester, polyglyceryl ether, diglyceryl ether, sugar ether, and sugar ester.

Examples of the polyoxyalkylene derivative include polyoxyethylene styrenated-phenyl ether (for example, NOIGEN (registered trademark) EA series manufactured by DKS Co. Ltd.); polyoxyethylene alkyl ether (for example, Emulgen (registered trademark) series manufactured by Kao Corporation); polyoxyethylene alkyl phenyl ether (for example, Emulsit (registered trademark) series manufactured by DKS Co. Ltd.); polyoxyethylene sorbitan fatty acid ester (for example, SORGEN (registered trademark) TW series manufactured by DKS Co. Ltd.); polyoxyethylene fatty acid ester (for example, EMANON (registered trademark) series manufactured by Kao Corporation); polyoxypropylene sorbitol (for example, UNIOL (registered trademark) HS-1600D manufactured by NOF CORPORATION); polyoxyalkylene diglyceryl ether such as polyoxyethylene diglyceryl ether (for example, SC-E series manufactured by Sakamoto Yakuhin Kogyo Co., Ltd.) or polyoxypropylene diglyceryl ether (for example, SY-DP series manufactured by Sakamoto Yakuhin Kogyo Co., Ltd.); polyoxyalkylene polyglyceryl ether such as polyoxyethylene polyglyceryl ether, polyoxypropylene polyglyceryl ether, or polyoxyethylene polyoxypropylene glycol ether (for example, EPAN manufactured by DKS Co. Ltd.); and a compound added with polyalkylene oxide (for example, Surfynol (registered trademark) 465 manufactured by Air Products Japan K.K.; or TMP series manufactured by NIPPON NYUKAZAI CO., LTD.).

Since the vinyl alcohol tends not to exist alone as a stable compound, the vinyl alcohol polymer is obtained by polymerization of a vinyl carboxylate monomer such as a vinyl acetate monomer to obtain polyvinyl carboxylate, followed by saponification (hydrolysis). Therefore, for example, a vinyl alcohol polymer obtained using a vinyl acetate monomer as a raw material has, as a functional group, $—OCOCH_3$ and hydrolyzed —OH in the molecule, and the proportion of —OH is defined as a saponification degree. That is, a vinyl alcohol polymer whose saponification degree is not 100% has a structure which is substantially a copolymer of vinyl acetate and vinyl alcohol. Furthermore, the vinyl alcohol polymer may be one in which a vinyl carboxylate monomer such as a vinyl acetate monomer and another vinyl group-containing monomer (for example, ethylene, propylene, styrene, or vinyl chloride) are copolymerized, and all or some of the portions derived from the vinyl carboxylate monomer are saponified. Specific examples of such a vinyl alcohol polymer include PVA-403 manufactured by Kuraray Co., Ltd. and JC-25 manufactured by JAPAN VAM & POVAL CO., LTD. In the present specification, these are collectively defined as "vinyl alcohol polymer".

The vinyl alcohol polymer may be a derivative of a homopolymer of vinyl alcohol (that is, a polymer having a saponification degree of 100%), a derivative of a copolymer of a vinyl alcohol monomer and other vinyl group-containing monomer (for example, ethylene, propylene, styrene, vinyl chloride, or vinyl acetate), or the like. Examples of such a derivative include compounds in which at least a part of hydroxyl group is substituted with an amino group, a carboxyl group, an ester group, and the like and compounds in which at least a part of hydroxyl group is modified, and specific examples thereof include reactive polyvinyl alcohols (for example, GOHSEFIMER (registered trademark) Z manufactured by Nippon Synthetic Chemical Industry Co., Ltd.), cationized polyvinyl alcohols (for example, GOHSEFIMER (registered trademark) K manufactured by Nippon Synthetic Chemical Industry Co., Ltd.), anionized polyvinyl alcohols (for example, GOHSERAN (registered trademark) L and GOHSENOL (registered trademark) T manufactured by Nippon Synthetic Chemical Industry Co., Ltd.), and hydrophilic group-modified polyvinyl alcohols (for example, ECOMATI (registered trademark) manufactured by Nippon Synthetic Chemical Industry Co., Ltd.).

Examples of the other water-soluble nonionic compounds include polyethylene glycol monolaurate, polyethylene glycol monostearate, polyethylene glycol distearate, polyethylene glycol monooleate, and polyoxyethylene hydrogenated castor oil.

The weight average molecular weight of the polymer compound (B) is preferably in the following range. The weight average molecular weight of the polymer compound (B) is preferably 100 or more, more preferably 300 or more, and further preferably 500 or more, from the viewpoint that there is a tendency that favorable flatness is easily obtainable when an insulating material (silicon oxide or the like) is polished. The weight average molecular weight of the polymer compound (B) is preferably 10000 or less, more preferably 7000 or less, and further preferably 5000 or less, from the viewpoint that there is a tendency that a favorable polishing rate is easily obtainable when an insulating material (silicon oxide or the like) is polished. From these viewpoints, the weight average molecular weight of the polymer compound (B) is preferably 100 to 10000, more preferably 300 to 7000, and further preferably 500 to 5000.

The content of the polymer compound (B) is preferably in the following range based on the total mass of the polishing liquid. The content of the polymer compound (B) is preferably 0.005% by mass or more, more preferably 0.01% by mass or more, further preferably 0.015% by mass or more, particularly preferably 0.02% by mass or more, extremely preferably 0.03% by mass or more, and highly preferably 0.04% by mass or more, from the viewpoint of easily and sufficiently securing the effect of suppressing the polishing of a stopper material. The content of the polymer compound (B) is preferably 2% by mass or less, more preferably 1.5% by mass or less, further preferably 1% by mass or less, particularly preferably 0.5% by mass or less, extremely preferably 0.1% by mass or less, and highly preferably 0.05% by mass or less, from the viewpoint of easily securing a sufficient polishing rate of an insulating material. From these viewpoints, the content of the polymer compound (B) is preferably 0.005 to 2% by mass, more preferably 0.01 to 1.5% by mass, further preferably 0.015 to 1% by mass, particularly preferably 0.02 to 0.5% by mass, extremely preferably 0.03 to 0.1% by mass, and highly preferably 0.04 to 0.05% by mass.

[pH Adjusting Agent]

The polishing liquid of the present embodiment can contain a pH adjusting agent (excluding a compound corresponding to the first nitrogen-containing compound, the second nitrogen-containing compound, the polymer compound (A), or the polymer compound (B)). The pH can be adjusted to a desired pH by the pH adjusting agent. The pH adjusting agent is not particularly limited, and examples thereof include basic compounds such as ammonia, sodium hydroxide, potassium hydroxide, and calcium hydroxide; and acid components such as organic acid components and inorganic acid components. Examples of the inorganic acid component include nitric acid, sulfuric acid, hydrochloric acid, phosphoric acid, and boric acid. The pH adjusting agent may be used singly or in combination of two or more kinds thereof. In the case of using the polishing liquid in polishing of semiconductors, ammonia or an acid component can be suitably used.

As the pH adjusting agent, from the viewpoint of easily obtaining a favorable polishing rate of an insulating material, basic compounds are preferred, and ammonia is more preferred. Since the basic compound is likely to cause a recessed defect, the content of the basic compound is preferably small as much as possible. The content of the basic compound is preferably 0.04 mol/kg or less, more preferably 0.035 mol/kg or less, and further preferably 0.03 mol/kg or less, based on the total amount of the polishing liquid, from the viewpoint of further suppressing the occurrence of defects. The content of the basic compound may be 0.01 mol/kg or more or 0.015 mol/kg or more, based on the total amount of the polishing liquid.

[Other Additives]

The polishing liquid of the present embodiment can contain an additive separately from the first nitrogen-containing compound, the second nitrogen-containing compound, the polymer compound (A), the polymer compound (B), and the pH adjusting agent. Examples of such an additive include water-soluble polymer compounds. In the case of storing the polishing liquid while being divided into a slurry and an additive liquid, these other additives are preferably contained in the additive liquid. Examples of the water-soluble polymer compound include polysaccharides such as alginic acid, pectinic acid, carboxymethyl cellulose, agar, curdlan, and pullulan. These additives may be used singly or in combination of two or more kinds thereof. The content of these additives is preferably 0.01 to 5% by mass based on the total mass of the polishing liquid.

The content of the oxidizing agent (for example, hydrogen peroxide) in the polishing liquid of the present embodiment may be less than 0.1% by mass, less than 0.07% by mass, less than 0.05% by mass, or less than 0.01% by mass. The polishing liquid of the present embodiment may not contain an oxidizing agent (for example, hydrogen peroxide). The polishing liquid of the present embodiment may not contain aromatic carboxylic acid. The content of sulfonic acid in the polishing liquid of the present embodiment may be less than 0.01% by mass. The polishing liquid of the present embodiment may not contain sulfonic acid. The polishing liquid of the present embodiment may not contain a diazine compound.

(Water)

Water is not particularly limited, but deionized water, ion-exchanged water, ultrapure water, and the like are preferred. The content of water may be the balance of the content of the above respective components and is not particularly limited as long as water is contained in the polishing liquid. Incidentally, the polishing liquid may further contain a solvent other than water, for example, a polar solvent such as ethanol or acetone, as necessary.

(pH)

The pH of the polishing liquid of the present embodiment is preferably 3.0 or more, more preferably 3.5 or more, further preferably more than 3.5, particularly preferably 4.0 or more, extremely preferably more than 4.0, highly preferably 4.5 or more, even more preferably 5.0 or more, further preferably 5.5 or more, particularly preferably 6.0 or more, and extremely preferably more than 6.0, from the viewpoint of easily obtaining an excellent polishing rate of an insulating material and the viewpoint of easily obtaining sufficient storage stability of the abrasive grains and easily suppressing the occurrence of the aggregation of the abrasive grains, and the like. The pH of the polishing liquid of the present embodiment is preferably 8.0 or less, more preferably less than 8.0, further preferably 7.5 or less, particularly preferably 7.0 or less, and extremely preferably 6.5 or less, from the viewpoint of easily suppressing the occurrence of defects (recessed defects and the like) and the viewpoint of easily securing surface flatness after polishing (easily suppressing dishing and the like). From these viewpoints, the pH of the polishing liquid of the present embodiment is preferably 3.0 to 8.0, more preferably 3.5 or more and less than 8.0, further preferably more than 3.5 and 7.5 or less, particularly preferably 4.0 to 7.5, extremely preferably more than 4.0 and 7.5 or less, highly preferably 4.5 to 7.0, even more preferably 5.0 to 6.5, further preferably 5.5 to 6.5, particularly preferably 6.0 to 6.5, and extremely preferably more than 6.0 and 6.5 or less. The pH of the polishing liquid is the pH of the polishing liquid at 25° C.

The pH of the polishing liquid can be measured using a pH meter (for example, trade name: Model PH81 manufactured by Yokogawa Electric Corporation). For example, after 2-point calibration using standard buffer solution (phthalate pH buffer solution, pH: 4.01 (25° C.) and neutral phosphate pH buffer solution, pH: 6.86 (25° C.)), the electrode is placed in the polishing liquid, and a value upon stabilization after an elapse of 2 minutes or longer at 25° C. can be measured as the pH.

<Method for Producing Polishing Liquid>

A method for producing a polishing liquid of the present embodiment includes a polishing liquid producing step of obtaining a polishing liquid by mixing at least the abrasive grains, the first nitrogen-containing compound, the second nitrogen-containing compound, and water. In the polishing liquid producing step, the respective components may be mixed simultaneously or the respective components may be mixed sequentially. The method for producing a polishing liquid of the present embodiment may include a step of obtaining abrasive grains (for example, abrasive grains containing cerium) and a step of obtaining of an additive (for example, the polymer compound (A) and/or the polymer compound (B)), before the polishing liquid producing step.

The method for producing the polishing liquid of the present embodiment may include a dispersing step of dispersing abrasive grains in water. The dispersing step is, for example, a step of mixing abrasive grains and a dispersant. In this case, the dispersant is preferably added in the step of obtaining a slurry. That is, a slurry preferably contains a dispersant. In the dispersing step, for example, abrasive grains, a dispersant, and a water are mixed, and the abrasive grains are dispersed in water to obtain a slurry.

<Polishing Liquid Set>

The polishing liquid of the present embodiment may be stored as a multi-pack type (for example, two-pack type) polishing liquid set (for example, a polishing liquid set for CMP) while the constituent components of the polishing liquid are divided into the slurry and the additive liquid so that the slurry (first liquid) and the additive liquid (second liquid) are mixed to obtain the polishing liquid. The slurry contains, for example, at least abrasive grains and water. The additive liquid contains, for example, at least an additive (for example, the first nitrogen-containing compound and the second nitrogen-containing compound) and water. The pH adjusting agent may be contained in the slurry as long as the polarity of the potential of the abrasive grains contained in the slurry is not changed. The constituent components of the polishing liquid may be stored while being divided into two liquids of a slurry and an additive liquid or may be stored while being divided into three or more liquids.

In the polishing liquid set, the slurry and the additive liquid are mixed immediately before polishing or during polishing to prepare the polishing liquid. The multi-pack type polishing liquid set may be stored as a stock solution for a slurry and a stock solution for an additive liquid with a reduced water content, and used by dilution with water immediately before the polishing or during the polishing.

<Polishing Method>

A polishing method of the present embodiment includes a polishing step of polishing a surface to be polished by using the polishing liquid of the present embodiment or a polishing liquid obtained by mixing the slurry and the additive liquid of the polishing liquid set of the present embodiment. The surface to be polished can contain, for example, a silicon material. The surface to be polished may contain at least one selected from the group consisting of polysilicon, amorphous silicon, and single-crystal silicon, or may contain amorphous silicon.

The polishing method of the present embodiment is, for example, a method for polishing a base substrate having a surface to be polished containing a silicon material. The polishing step may be a step of selectively (preferentially) polishing an insulating material with respect to a silicon material (stopper material). The polishing step may be a step of selectively (preferentially) polishing silicon oxide with respect to a silicon material (polysilicon, amorphous silicon, or the like). The polishing step may be a step of polishing silicon oxide using a silicon material (polysilicon, amorphous silicon, or the like) as a stopper material. Examples of the stopper material include single-crystal silicon, polysilicon, and amorphous silicon.

The polishing method of the present embodiment may be a polishing method for a base substrate which has a first member containing a silicon material and a second member containing an insulating material and disposed on the first member. The polishing step may include a step of polishing the second member until the first member is exposed, by using the polishing liquid of the present embodiment or a polishing liquid obtained by mixing the slurry and the additive liquid of the polishing liquid set of the present embodiment. The polishing step may include a step of polishing the first member and the second member, by using the polishing liquid of the present embodiment or a polishing liquid obtained by mixing the slurry and the additive liquid of the polishing liquid set of the present embodiment, after the first member is exposed.

Examples of the insulating material include an inorganic insulating material and an organic insulating material. Examples of the inorganic insulating material include silicon-based insulating materials. Examples of the silicon-based insulating material include silica-based materials such as silicon oxide, silicon nitride, fluorosilicate glass, organosilicate glass, and hydrogenated silsesquioxane; silicon carbide; silicon nitride; and carbon-containing silicon oxide. The silicon oxide may be carbon-containing silicon oxide, nitrogen-containing silicon oxide, nitrogen carbon-containing silicon oxide, or the like. Examples of the organic insulating material include wholly aromatic based low dielectric constant insulating materials. The insulating material (silicon oxide or the like) may be doped with an element such as phosphorus or boron.

The polishing step may be a step of removing at least a part of an insulating member (a member containing an insulating material) using the polishing liquid of the present embodiment to expose a stopper. For example, the polishing method of the present embodiment may be a polishing method of polishing a base substrate having an insulating member on the surface. The polishing method of the present embodiment includes, for example, a base substrate preparing step, a base substrate disposing step, and a polishing step. In the base substrate preparing step, for example, a base substrate having a stopper and an insulating member disposed on the stopper is prepared. In the base substrate disposing step, for example, the base substrate is disposed such that the insulating member faces a polishing pad. In the polishing step, for example, at least a part of the insulating member is removed. In the polishing step, for example, while an insulating member of the base substrate having the insulating member is pressed on a polishing pad of a polishing platen, the polishing liquid is supplied between the polishing pad and the insulating member, and the base substrate and the polishing platen are relatively moved to polish and remove at least a part of the insulating member. The shape of the insulating member is not particularly limited, and for example, is a film shape (an insulating film) The shape of the stopper is not particularly limited, and for example, is a film shape (a stopper film: for example, a polysilicon film or an amorphous silicon film).

Examples of the base substrate include base substrates in which an insulating member is formed on a substrate for semiconductor element production (a semiconductor substrate at the stage when a circuit element and a wiring pattern are formed, a semiconductor substrate at the stage when a circuit element is formed, or the like).

By polishing an insulating material formed on a semiconductor substrate using the polishing liquid of the present embodiment, irregularities on the surface of the insulating material are eliminated and thus a flat and smooth surface over the entire surface of the base substrate can be obtained. The polishing method of the present embodiment can be used, for example, in the flattening step of an interlayer insulating film, a BPSG film, or the like, the STI formation step, and the like.

Figure 2:
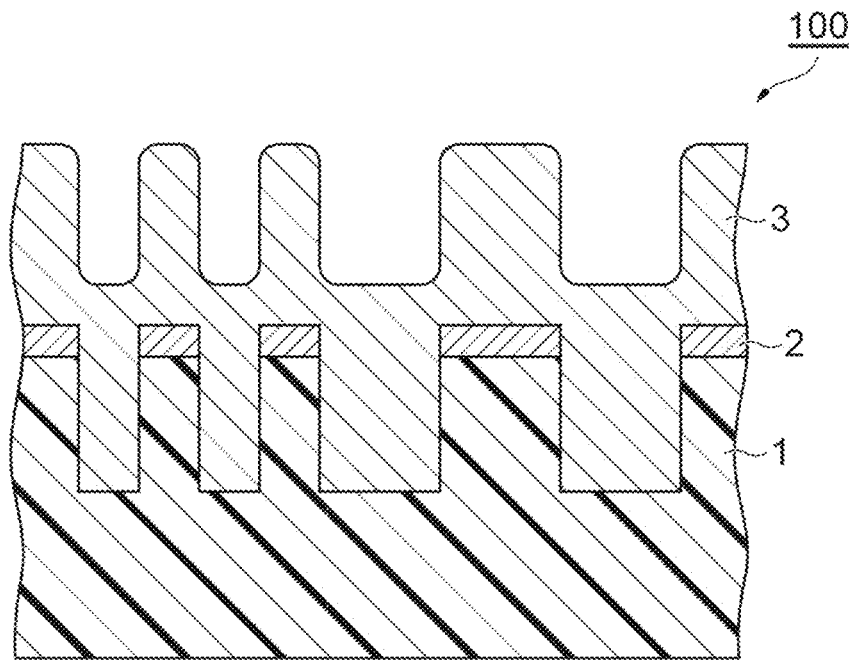
FIG. 2 is a schematic cross-sectional view illustrating a polishing method of an embodiment of the present invention.
Figure 2:
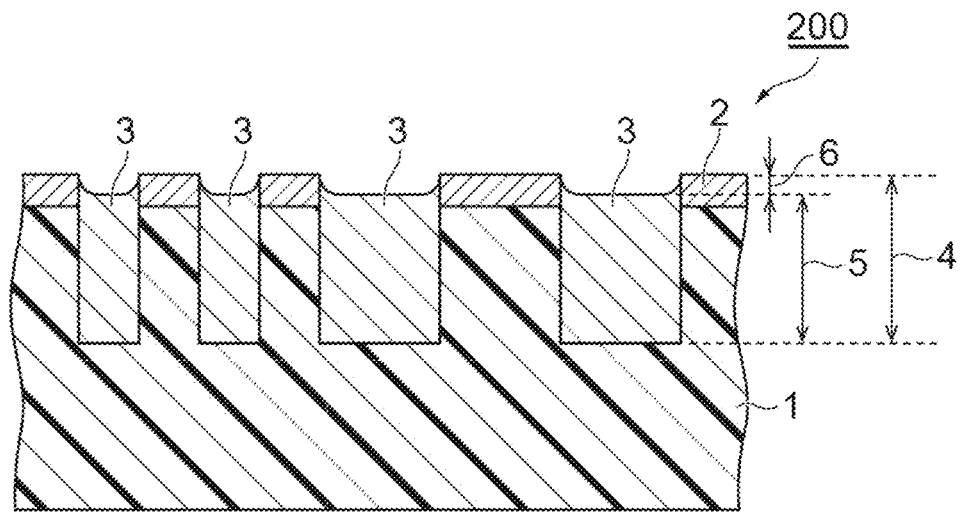

FIG. 2 is a schematic cross-sectional view illustrating an example of a polishing method. First, as illustrated in FIG. 2(A), a base substrate 100, which includes a wafer 1 in which irregularities configured by concave portions (trench portions) and convex portions (active portions) are formed on the surface, stoppers 2 (for example, polysilicon films or amorphous silicon films) formed on the convex portions of the wafer 1, and an insulating member 3 (for example, a silicon oxide film) formed on the wafer 1 and the stoppers 2 so as to fill the irregularities on the surface of the wafer 1, is prepared. For example, the insulating member 3 can be accumulated and formed by a plasma TEOS method or the like.

Then, a base substrate 200 as illustrated in FIG. 2(B) is obtained by polishing and removing the insulating member 3 until the stoppers 2 on the convex portions of the wafer 1 are exposed, by using the polishing liquid of the present embodiment. In the base substrate 200 after the completion of polishing, a dishing amount 6, which is a value obtained by subtracting a thickness 5 of the insulating member 3 in the trench portion from a depth 4 of the trench portion, is preferably small. Furthermore, in the base substrate 200, the number of recessed defects of the stoppers 2 is preferably small.

Examples of the polishing apparatus include a polishing apparatus (trade name: Mirra-3400, Reflexion LK) manufactured by Applied Materials, Inc. and a polishing apparatus (trade name: F-REX300) manufactured by EBARA CORPORATION.

As the polishing pad, common unwoven cloth, a foamed body, an unfoamed body, and the like can be used. As the material of the polishing pad, it is possible to use a resin such as polyurethane, an acrylic resin, polyester, an acrylic-ester copolymer, polytetrafluoroethylene, polypropylene, polyethylene, poly-4-methylpentene, cellulose, cellulose ester, polyamide (for example, Nylon (trade name) and aramid), polyimide, polyimidamide, a polysiloxane copolymer, an oxirane compound, a phenolic resin, polystyrene, polycarbonate, or an epoxy resin. As the material of the polishing pad, particularly, from the viewpoint of obtaining a further excellent polishing rate and further excellent flatness, foamed polyurethane and unfoamed polyurethane are preferred. The polishing pad may be subjected to groove processing by which the polishing liquid accumulates thereon.

Polishing conditions are not limited, but the rotation speed of the polishing platen is preferably 200 $min^{-1}$ (rpm) or less such that the base substrate is not let out, and the polishing pressure (processing load) to be applied to the base substrate is preferably 100 kPa or less from the viewpoint of sufficiently suppressing the generation of polishing scratches. The polishing liquid is preferably continuously supplied to the polishing pad with a pump or the like during polishing. The amount supplied for this is not limited, but it is preferable that the surface of the polishing pad is always covered with the polishing liquid.

The base substrate after the completion of polishing is preferably thoroughly washed in flowing water to remove the particles adhering to the base substrate. For the washing, dilute hydrofluoric acid or ammonia water may be used in addition to pure water, and a brush may be used to increase the washing efficiency. Furthermore, it is preferable that, after washing, the water droplets adhering to the base substrate are removed off using a spin dryer or the like, and then the base substrate is dried.

As the base substrate to be polished by the polishing method of the present embodiment, for example, base substrates including a discrete semiconductor such as diode, transistor, compound semiconductor, thermistor, varistor, or thyristor; a memory element such as DRAM (dynamic random access memory), SRAM (static random access memory), EPROM (erasable programmable read-only memory), mask ROM (mask read-only memory), EEPROM (electrically erasable programmable read-only memory), or flash memory; a logic circuit element such as a microprocessor, DSP, or ASIC; an integrated circuit element such as a compound semiconductor typified by MMIC (monolithic microwave integrated circuit); a hybrid integrated circuit (hybrid IC) or a photoelectric conversion element such as light emitting diode or charge-coupled element; and the like can be applied.

The polishing liquid of the present embodiment is not limited to be applied to polishing of an insulating member or the like formed on a semiconductor substrate as described in the aforementioned embodiment, and can be applied to polishing of inorganic insulating materials such as silicon oxide, glass, and silicon nitride that are formed on circuit boards with predetermined wirings; and materials mainly containing Al, Cu, Ti, TiN, W, Ta, TaN, or the like.

As electronic components including a base substrate polished by the polishing method of the present embodiment, various examples are mentioned. Examples of electronic components include not only semiconductor elements but also optical glass such as photomask, lens, and prisms; inorganic conductive films such as ITO; integrated optical circuits composed of glass and crystalline materials; optical switching elements; optical waveguides; end faces of optical fibers; optical single crystals such as scintillators; solid laser single crystals; sapphire substrates for blue laser LED; semiconductor single crystals such as SiC, GaP, and GaAs; glass substrates for magnetic disk; and magnetic heads. In these electronic components, each layer is polished by the polishing liquid of the present embodiment so that high integration can be achieved and excellent characteristics can be exhibited.

<Defect Suppression Method>

A defect suppression method of the present embodiment is a defect suppression method suppressing the occurrence of defects in polishing of a surface to be polished containing a stopper material. The defect suppression method of the present embodiment includes a polishing step of polishing a surface to be polished by using the polishing liquid of the present embodiment or a polishing liquid obtained by mixing the slurry and the additive liquid of the polishing liquid set of the present embodiment. In the defect suppression method of the present embodiment, by using the first nitrogen-containing compound and the second nitrogen-containing compound acting as a defect inhibitor, the occurrence of defects in polishing of a surface to be polished containing a stopper material can be suppressed, and particularly, the occurrence of defects based on chemical action can be suppressed. For example, the defect suppression method of the present embodiment further includes an observing step of observing defects occurring in a surface to be polished, after the polishing step. The stopper material may contain at least one selected from the group consisting of polysilicon, amorphous silicon, and single-crystal silicon, or may contain amorphous silicon.

EXAMPLES

Hereinafter, the present invention will be described by means of Examples, but the present invention is not limited to these Examples.

<Preparation of Constituent Components of Polishing Liquid for CMP>

(Abrasive Grains: Cerium Oxide Particles)

40 kg of commercially available cerium carbonate hydrate was placed in an alumina container and fired at 830° C. for 2 hours in air to obtain 20 kg of yellowish-white powder. This powder was subjected to phase identification by an X-ray diffraction method, by which it was identified as cerium oxide. 20 kg of cerium oxide powder thus obtained was subjected to dry pulverization using a jet mill to obtain cerium oxide powder containing cerium oxide particles.

To measure the average particle size (D50) of the abrasive grains, the abrasive grains and water were mixed to have a transmittance (H) of 60 to 70%, as measured with respect to He—Ne laser, thereby obtaining a measurement sample. The D50 of the measurement sample was measured with a laser diffraction type particle size distribution meter (trade name: LA-920, manufactured by HORIBA, Ltd., refractive index: 1.93, light source: He—Ne laser, absorption: 0), and as a result, the value of D50 was 150 nm.

(Additive)

As additives, the following compounds were prepared.

[First Nitrogen-Containing Compound]

3-Aminopyridine, pyrazinamide, nicotinamide, and benzotriazole

[Second Nitrogen-Containing Compound]

Polyoxyethylene laurylamine (HLB value=13), polyoxyethylene stearylamine (HLB value=15), polyoxyethylene beef tallow alkylamine (HLB value=17), polyoxyethylene oleylamine (HLB value=9), and polyoxyethylene alkylpropylenediamine (HLB value=11)

[Other Nitrogen-Containing Compound]

Polyoxyethylene laurylamine (HLB value=6)

[Polymer Compound (A)]

Polyacrylic acid having a weight average molecular weight of 2500 (value in terms of sodium polyacrylate)

[Polymer Compound (B)]

Polyoxyethylene polyoxypropylene glycol ether having a weight average molecular weight of 1200

[pH Adjusting Agent]

25% by mass of ammonia water

<Preparation of Polishing Liquid for CMP>

The constituent components prepared as described above were dispersed or dissolved in water to have the contents of Table 1 or Table 2, thereby obtaining a polishing liquid for CMP. In the tables, the content of the pH adjusting agent indicates the content of ammonia not containing moisture. The pH of the polishing liquid for CMP was adjusted by the pH adjusting agent and was measured by trade name: Model PH81 manufactured by Yokogawa Electric Corporation.

<Liquid Layer Isolation of Second Nitrogen-Containing Compound>

The presence/absence of the liquid layer isolation of the second nitrogen-containing compound in the polishing liquid for CMP was checked by visually checking the polishing liquid for CMP. The results are shown in Table 1 and Table 2.

<Defect Evaluation>

As a test wafer for CMP evaluation of the number of defects, a wafer having an amorphous silicon film on a silicon substrate was prepared.

A polishing apparatus (Reflexion LK manufactured by Applied Materials, Inc.) was used in polishing of the test wafer for CMP evaluation. The test wafer for CMP evaluation was set in a holder mounting an adsorption pad for attachment of the base substrate. A polishing pad made of a porous urethane resin (Model No. IC1010, manufactured by Rohm & Haas Nitta Co.) was attached to a polishing platen of the polishing apparatus. The holder was put on the polishing platen while the surface on which the amorphous silicon film was disposed faced downwards, and a processing load was set to 3.0 psi (about 21 kPa).

While the polishing liquid for CMP (excluding Comparative Examples 4 and 5) was added dropwise onto the polishing platen at a speed of 250 mL/min, the polishing platen and the test wafer for CMP evaluation were rotated at 93 $min^{-1}$ and 87 $min^{-1}$, respectively, and polishing was performed for 180 seconds. The wafer after polishing was thoroughly washed with pure water and dried.

Five sites in the center portion of the amorphous silicon film were observed using an optical microscope (trade name: DSX-510, manufactured by Olympus Corporation) under the conditions of object lens: 20 times and magnification: 1.5 times, and the number of recessed defects (recessed defect number) was counted. The area of one viewing field was 0.5 $mm^2$. The average value of the five sites was acquired as the number of defects, the case of the number of defects being 0 to 4 was evaluated as "A", the case of the number of defects being 5 to 9 was evaluated as "B", and the case of the number of defects being 10 or more was evaluated as "C". The results are shown in Table 1 and Table 2. From Table 1 and Table 2, in Examples, it was clear that the occurrence of defects can be suppressed. Comparative Examples 4 and 5 were not suitable as the polishing liquid for CMP since the liquid layer isolation of the second nitrogen-containing compound was confirmed, and thus the defect evaluation was not performed.

TABLE 1

| | | HLB value | Unit | Example 1 | 2 | 3 | 4 | 5 | 6 | 7 | 8 | 9 |
|---|---|---|---|---|---|---|---|---|---|---|---|---|
| Abrasive grains | | | % by mass | 0.7 | 0.7 | 0.7 | 0.7 | 0.7 | 0.7 | 0.7 | 0.7 | 0.7 |
| First nitrogen-containing compound | 3-Aminopyridine | | mass | 0.1 | — | — | — | 0.1 | 0.1 | 0.1 | 0.1 | 0.1 |
| | Pyrazinamide | | | — | 0.1 | — | — | — | — | — | — | — |
| | Nicotinamide | | | — | — | 0.1 | — | — | — | — | — | — |
| | Benzotriazole | | | — | — | — | 0.1 | — | — | — | — | — |
| Second nitrogen-containing compound | Polyoxyethylene laurylamine | 13 | | 0.0005 | 0.0005 | 0.0005 | 0.0005 | 0.01 | — | — | — | — |
| | Polyoxyethylene stearylamine | 15 | | — | — | — | — | — | 0.005 | — | — | — |
| | Polyoxyethylene beef tallow alkylamine | 17 | | — | — | — | — | — | — | 0.005 | — | — |
| | Polyoxyethylene oleylamine | 9 | | — | — | — | — | — | — | — | 0.005 | — |
| | Polyoxyethylene alkylpropylenediamine | 11 | | — | — | — | — | — | — | — | — | 0.005 |
| Polyacrylic acid | | | | 0.3 | 0.3 | 0.3 | 0.3 | 0.3 | 0.3 | 0.3 | 0.3 | 0.3 |
| Polyoxyethylene polyoxypropylene glycol ether | | | | 0.04 | 0.04 | 0.04 | 0.04 | 0.04 | 0.04 | 0.04 | 0.04 | 0.04 |
| pH adjusting agent | | | mol/kg | 0.021 | 0.026 | 0.026 | 0.026 | 0.021 | 0.021 | 0.021 | 0.021 | 0.021 |
| pH | | | — | 6.2 | 6.3 | 6.3 | 6.3 | 6.2 | 6.2 | 6.2 | 6.2 | 6.2 |
| Liquid layer isolation of second nitrogen-containing compound | | | — | Absent | Absent | Absent | Absent | Absent | Absent | Absent | Absent | Absent |
| Defect evaluation | Recessed defect number | | number/ 0.5 $mm^2$ | 2 | 2 | 2 | 2 | 0 | 2 | 2 | 2 | 2 |
| | Recessed defect evaluation | | — | A | A | A | A | A | A | A | A | A |

TABLE 2

| | | HLB value | Unit | Comparative Example 1 | 2 | 3 | 4 | 5 |
|---|---|---|---|---|---|---|---|---|
| Abrasive grains | | | % by mass | 0.7 | 0.7 | 0.7 | 0.7 | 0.7 |
| First nitrogen-containing compound | 3-Aminopyridine | | mass | — | 0.1 | — | — | 0.1 |
| Second nitrogen-containing compound | Polyoxyethylene laurylamine | 13 | | — | — | 0.01 | — | — |
| Other nitrogen-containing compound | Polyoxyethylene laurylamine | 6 | | — | — | — | 0.01 | 0.01 |

TABLE 2-continued

| | HLB value | Unit | Comparative Example 1 | 2 | 3 | 4 | 5 |
|---|---|---|---|---|---|---|---|
| Polyacrylic acid | | | 0.3 | 0.3 | 0.3 | 0.3 | 0.3 |
| Polyoxyethylene polyoxypropylene glycol ether | | | 0.04 | 0.04 | 0.04 | 0.04 | 0.04 |
| pH adjusting agent | | mol/kg | 0.021 | 0.021 | 0.021 | 0.021 | 0.021 |
| pH | | — | 6.2 | 6.2 | 6.2 | 6.2 | 6.2 |
| Liquid layer isolation of second nitrogen-containing compound | | — | Absent | Absent | Absent | Present | Present |
| Defect evaluation  Recessed defect number | | number/ 0.5 mm² | 200 | 5 | 50 | Non-evaluated | Non-evaluated |
| Recessed defect evaluation | | — | C | C | B | — | — |

REFERENCE SIGNS LIST

1: wafer, 2: stopper, 3: insulating member, 4: depth, 5: thickness, 6: dishing amount, 100, 200: base substrate.

The invention claimed is:

1. A polishing liquid comprising: abrasive grains; a first nitrogen-containing compound; a second nitrogen-containing compound; and water, wherein the first nitrogen-containing compound contains at least one selected from the group consisting of (I) a compound having an aromatic ring containing one nitrogen atom in a ring and a hydroxyl group, (II) a compound having an aromatic ring containing one nitrogen atom in a ring and a functional group containing a nitrogen atom, (III) a compound having a 6-membered ring containing two nitrogen atoms in a ring, (IV) a compound having a benzene ring and a ring containing a nitrogen atom in the ring, and (V) a compound having a benzene ring to which two or more functional groups containing a nitrogen atom are bonded, and an HLB value of the second nitrogen-containing compound is 7 or more.

2. The polishing liquid according to claim 1, wherein the first nitrogen-containing compound contains the compound (II).

3. The polishing liquid according to claim 1, wherein the first nitrogen-containing compound contains the compound (III).

4. The polishing liquid according to claim 1, wherein the first nitrogen-containing compound contains nicotinamide.

5. The polishing liquid according to claim 4, wherein the abrasive grains contain cerium oxide.

6. The polishing liquid according to claim 1, wherein the second nitrogen-containing compound contains polyoxyethylene beef tallow alkylamine.

7. The polishing liquid according to claim 1, wherein a content of the abrasive grains is 0.7 to 20% by mass.

8. The polishing liquid according to claim 1, wherein the HLB value of the second nitrogen-containing compound is 17 or more.

9. The polishing liquid according to claim 1, wherein the first nitrogen-containing compound contains aminopyridine.

10. The polishing liquid according to claim 1, wherein the first nitrogen-containing compound contains pyrazinamide.

11. The polishing liquid according to claim 1, wherein the second nitrogen-containing compound contains a compound represented by General Formula (X) below:

[Chemical Formula 1]

(X)

[In the formula, $R^1$, $R^2$, and $R^3$ each independently represent a polyoxyalkylene group or a hydrocarbon group which may have a substituent].

12. The polishing liquid according to claim 11, wherein the second nitrogen-containing compound contains a compound in which one or two of $R^1$, $R^2$, and $R^3$ in the above General Formula (X) are a polyoxyethylene group.

13. The polishing liquid according to claim 1, wherein the second nitrogen-containing compound contains at least one selected from the group consisting of polyoxyethylene oleylamine, polyoxyethylene laurylamine, polyoxyethylene stearylamine, polyoxyethylene beef tallow alkylamine, and polyoxyethylene alkylpropylenediamine.

14. The polishing liquid according to claim 1, further comprising a polymer compound (A) having at least one selected from the group consisting of a carboxylic acid group and a carboxylate group.

15. The polishing liquid according to claim 1, further comprising a nonionic polymer compound (B).

16. The polishing liquid according to claim 1, further comprising a basic compound.

17. The polishing liquid according to claim 16, wherein a content of the basic compound is 0.04 mol/kg or less.

18. The polishing liquid according to claim 1, wherein the abrasive grains contain a cerium compound.

19. The polishing liquid according to claim 1, wherein the abrasive grains contain cerium oxide.

20. The polishing liquid according to claim 1, wherein a content of the abrasive grains is 0.01 to 20% by mass.

21. The polishing liquid according to claim 1, wherein a pH is more than 4.0.

22. A polishing liquid set comprising:
constituent components of the polishing liquid according to claim 1 stored while being divided into a first liquid and a second liquid,
the first liquid containing the abrasive grains and water,
the second liquid containing the first nitrogen-containing compound, the second nitrogen-containing compound, and water.

23. A polishing method comprising a step of polishing a surface to be polished by using the polishing liquid according to claim 1.

24. The polishing method according to claim 23, wherein the surface to be polished contains at least one selected from the group consisting of polysilicon, amorphous silicon, and single-crystal silicon.

25. A defect suppression method suppressing occurrence of defects in polishing of a surface to be polished containing a stopper material, the method comprising:
   a step of polishing a surface to be polished by using the polishing liquid according to claim 1.

26. The defect suppression method according to claim 25, wherein the stopper material contains at least one selected from the group consisting of polysilicon, amorphous silicon, and single-crystal silicon.

27. A polishing method comprising a step of polishing a surface to be polished by using a polishing liquid obtained by mixing the first liquid and the second liquid of the polishing liquid set according to claim 22.

28. The polishing method according to claim 27, wherein the surface to be polished contains at least one selected from the group consisting of polysilicon, amorphous silicon, and single-crystal silicon.

29. A defect suppression method suppressing occurrence of defects in polishing of a surface to be polished containing a stopper material, the method comprising:
   a step of polishing a surface to be polished by using a polishing liquid obtained by mixing the first liquid and the second liquid of the polishing liquid set according to claim 22.

30. The defect suppression method according to claim 29, wherein the stopper material contains at least one selected from the group consisting of polysilicon, amorphous silicon, and single-crystal silicon.

* * * * *